United States Patent
Jeong et al.

(10) Patent No.: US 8,999,857 B2
(45) Date of Patent: Apr. 7, 2015

(54) METHOD FOR FORMING A NANO-TEXTURED SUBSTRATE

(75) Inventors: Sangmoo Jeong, Stanford, CA (US); Liangbing Hu, Mountain View, CA (US); Yi Cui, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 220 days.

(21) Appl. No.: 13/078,782

(22) Filed: Apr. 1, 2011

(65) Prior Publication Data

US 2011/0244692 A1 Oct. 6, 2011

Related U.S. Application Data

(60) Provisional application No. 61/320,695, filed on Apr. 2, 2010.

(51) Int. Cl.
| | |
|---|---|
| *H01L 21/30* | (2006.01) |
| *B82Y 40/00* | (2011.01) |
| *H01L 31/0236* | (2006.01) |
| *B82Y 30/00* | (2011.01) |
| *H01L 31/0376* | (2006.01) |
| *H01L 31/0392* | (2006.01) |
| *H01L 31/075* | (2012.01) |
| *H01L 31/20* | (2006.01) |
| *H01L 31/056* | (2014.01) |

(52) U.S. Cl.
CPC ............ *H01L 31/0236* (2013.01); *B82Y 30/00* (2013.01); *H01L 31/03762* (2013.01); *H01L 31/03921* (2013.01); *H01L 31/075* (2013.01); *H01L 31/202* (2013.01); *Y02E 10/548* (2013.01); *Y02E 10/52* (2013.01); *H01L 31/056* (2014.12); *Y10S 977/892* (2013.01)

(58) Field of Classification Search
USPC .................... 438/758, 780, 781; 977/892
See application file for complete search history.

(56) References Cited

U.S. PATENT DOCUMENTS

| | | | |
|---|---|---|---|
| 4,554,727 A | 11/1985 | Deckman et al. | |
| 4,633,030 A | 12/1986 | Cook | |
| 5,094,697 A | 3/1992 | Takabayashi et al. | |

(Continued)

OTHER PUBLICATIONS

Nikmanesh, Seahvosh J., "U.S. Appl. No. 12/948,025 Office Action Dec. 23, 2011",, Publisher: USPTO, Published in: US.

(Continued)

*Primary Examiner* — Alexander Ghyka
(74) *Attorney, Agent, or Firm* — Kaplan Breyer Schwarz & Ottesen, LLP

(57) ABSTRACT

A method for forming a nano-textured surface on a substrate is disclosed. An illustrative embodiment of the present invention comprises dispensing of a nanoparticle ink of nanoparticles and solvent onto the surface of a substrate, distributing the ink to form substantially uniform, liquid nascent layer of the ink, and enabling the solvent to evaporate from the nanoparticle ink thereby inducing the nanoparticles to assemble into an texture layer. Methods in accordance with the present invention enable rapid formation of large-area substrates having a nano-textured surface. Embodiments of the present invention are well suited for texturing substrates using high-speed, large scale, roll-to-roll coating equipment, such as that used in office product, film coating, and flexible packaging applications. Further, embodiments of the present invention are well suited for use with rigid or flexible substrates.

10 Claims, 10 Drawing Sheets

(56) References Cited

U.S. PATENT DOCUMENTS

| | | | |
|---|---|---|---|
| 5,101,260 | A | 3/1992 | Nath et al. |
| 5,103,851 | A | 4/1992 | Nishida et al. |
| 5,269,852 | A | 12/1993 | Nishida |
| 5,453,135 | A | 9/1995 | Nakagawa et al. |
| 5,810,945 | A | 9/1998 | Stutzmann et al. |
| 5,986,204 | A | 11/1999 | Iwasaki et al. |
| 6,072,117 | A | 6/2000 | Matsuyama et al. |
| 6,075,652 | A | 6/2000 | Ono et al. |
| 6,331,672 | B1 | 12/2001 | Matsuda et al. |
| 6,806,141 | B2 | 10/2004 | Kamins |
| 7,106,938 | B2 | 9/2006 | Baek et al. |
| 7,301,215 | B2 | 11/2007 | Kariya |
| 7,812,355 | B2 | 10/2010 | Shiroguchi et al. |
| 8,133,768 | B2 | 3/2012 | Ray et al. |
| 8,183,587 | B2 | 5/2012 | Samuelson et al. |
| 8,258,050 | B2 | 9/2012 | Cho et al. |
| 8,323,732 | B2 | 12/2012 | Ajayaghosh et al. |
| 2003/0138608 | A1* | 7/2003 | Landry-Coltrain et al. .. 428/195 |
| 2007/0120141 | A1 | 5/2007 | Moustakas et al. |
| 2008/0223436 | A1 | 9/2008 | den Boer et al. |
| 2009/0107548 | A1 | 4/2009 | Guerra |
| 2009/0126789 | A1 | 5/2009 | Li et al. |
| 2009/0135491 | A1 | 5/2009 | Endoh et al. |
| 2009/0223561 | A1 | 9/2009 | Kim et al. |
| 2009/0320910 | A1 | 12/2009 | Matsui et al. |
| 2009/0325365 | A1 | 12/2009 | Park et al. |
| 2010/0089443 | A1 | 4/2010 | Bloomstein et al. |
| 2010/0090341 | A1 | 4/2010 | Wan et al. |
| 2010/0243040 | A1 | 9/2010 | Kim |
| 2010/0269897 | A1 | 10/2010 | Sakai et al. |
| 2010/0282308 | A1 | 11/2010 | Okamoto |
| 2010/0326710 | A1 | 12/2010 | Zhang |
| 2011/0129956 | A1 | 6/2011 | Polito et al. |
| 2011/0180127 | A1 | 7/2011 | Wan et al. |
| 2011/0180141 | A1 | 7/2011 | Nishida et al. |
| 2012/0132275 | A1 | 5/2012 | Nishida et al. |

OTHER PUBLICATIONS

Atwater et al., "Plasmonics for improved photovoltaic devices", "Nature Materials www.nature.com/naturematerials", Mar. 2010, pp. 205-213, vol. 9, Publisher: Macmillan Publishers Limited.

Rosello Garcia, M., "PCT Application No. PCT/US2010/053576 Written Opinion Dec. 27, 2011",, Publisher: PCT, Published in: PCT.

Deckman et al., "Applications of surface textures produced with natural lithography", "Journal of Vacuum Science & Technology B", Oct.-Dec. 1983, pp. 1109-1112, vol. 1, No. 4, Publisher: American Vacuum Society, Published in: US.

Zhu et al., "Nanodome Solar Cells with Efficient Light Management and Self-Cleaning", "NanoLetters 2010 XP-002632310", 2010, pp. 1979-1984, Publisher: American Chemical Society, Published in: US.

Zhu et al., "Nanostructured photon management for high performance solar cells", "Materials Science and Engineering R 70 XP-027537230", 2010, pp. 330-340, Publisher: Elsevier B.V.

Law et al., "Nanowire dye-sensitized solar cells", "nature materials—Letters www.nature.com/naturematerials", Jun. 2005, vol. 4, Publisher: Nature Publishing Group, Published in: US.

Hsu et al., "Wafer-scale silicon nanopillars and nanocones by Langmuir-Blodgett assembly and etching", "Applied Physics Letters XP-012111721", 2008, pp. 133109-1-133109-3, vol. 93, No. 13, Publisher: American Institute of Physics, Published in: US.

Rosello Garcia, M., "PCT Application No. PCT/US2010/053576 International Search Report May 24, 2011",, Publisher: PCT, Published in: PCT.

Jordan Klein, "Related U.S. Appl. No. 13/305,731", "Non-Final Office Action", Feb. 7, 2014, Publisher: USPTO.

Jordan M. Klein, "Related U.S. Appl. No. 12/909,064 Office Action", Feb. 14, 2013, Publisher: USPTO.

* cited by examiner

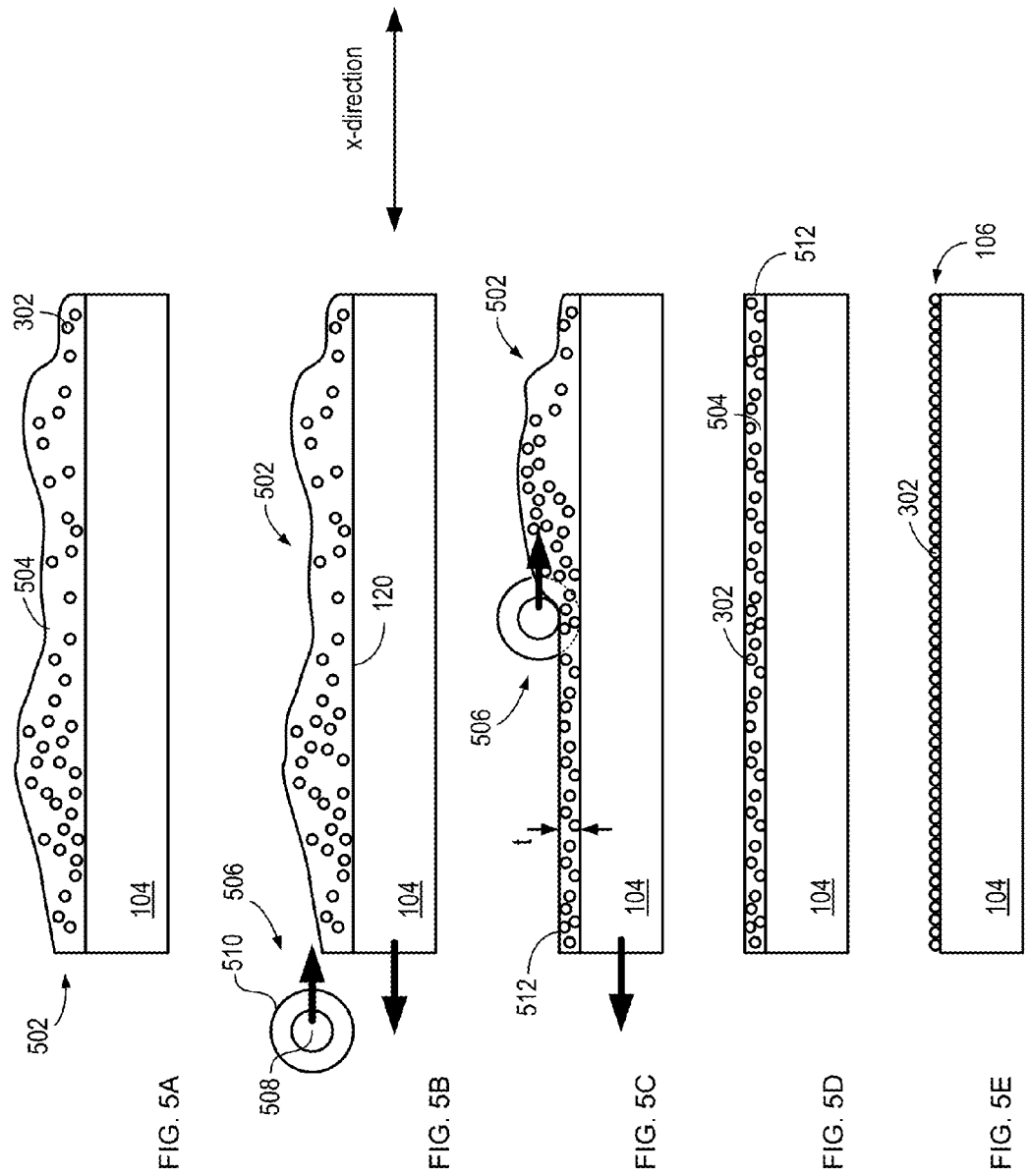

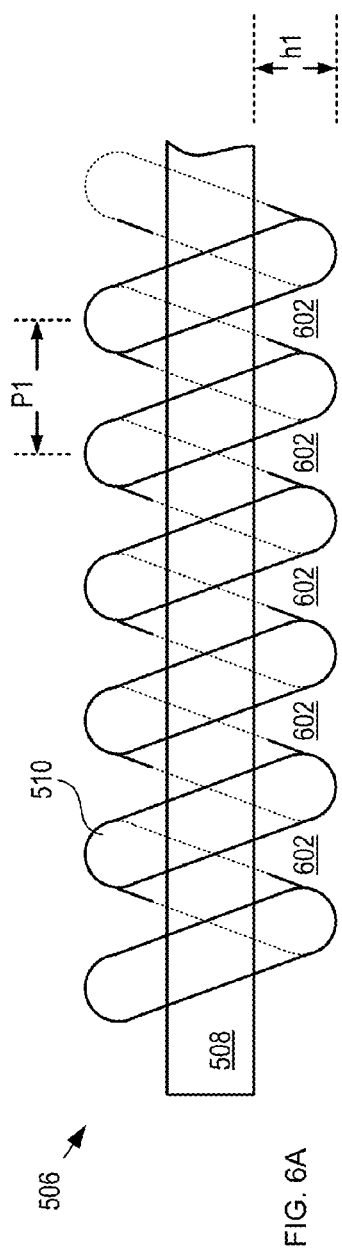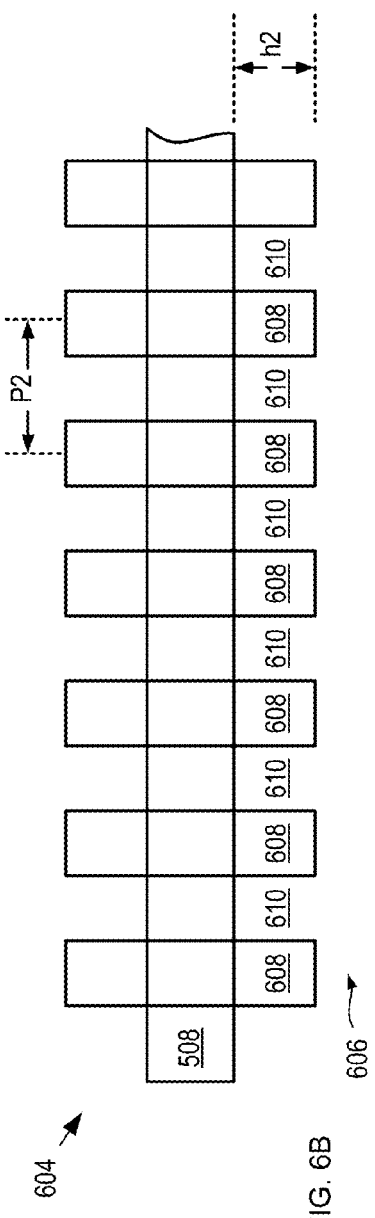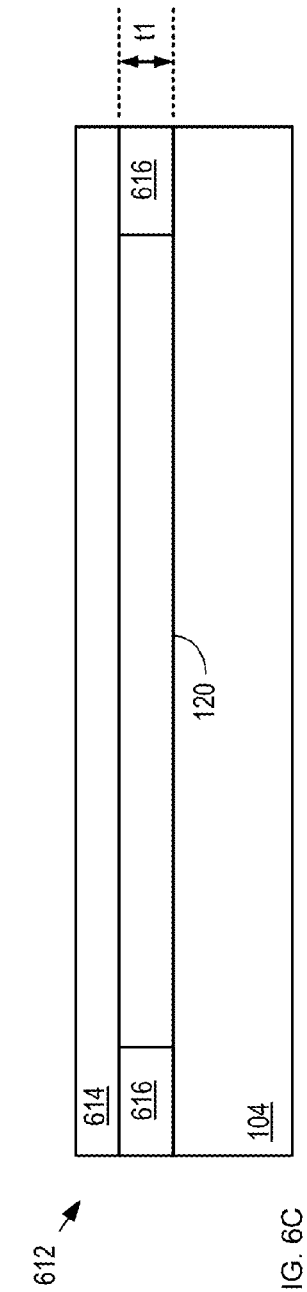

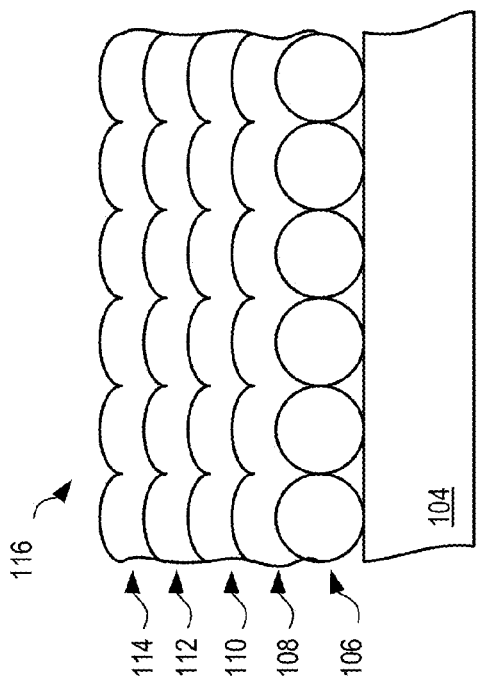
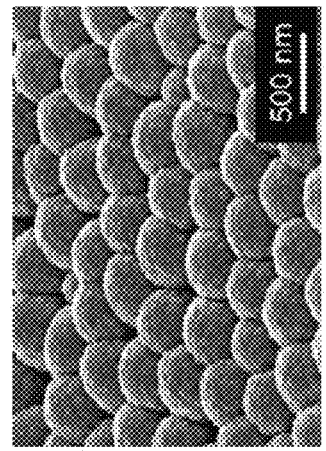
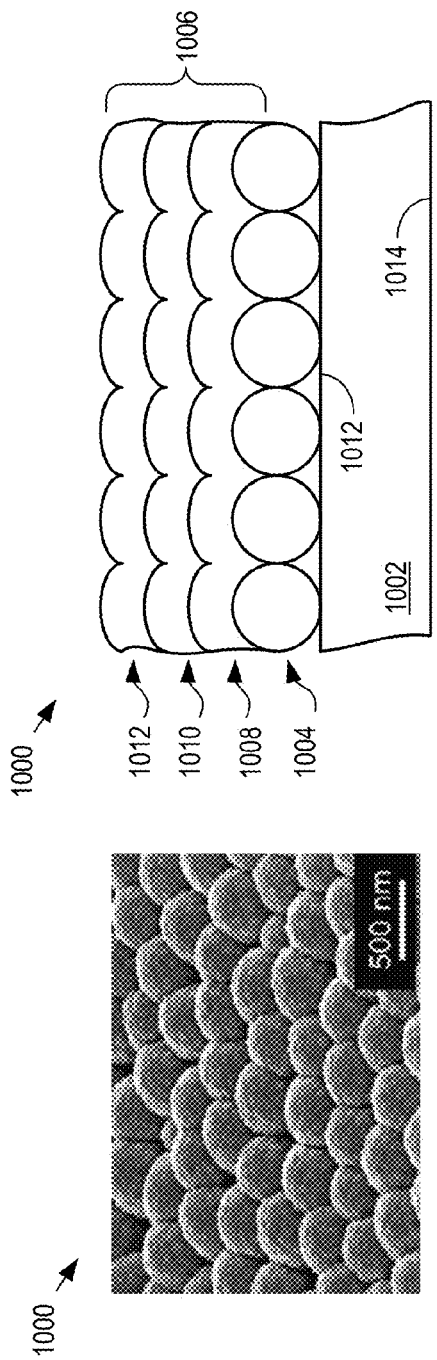
FIG. 9
FIG. 10A
FIG. 10B

US 8,999,857 B2

METHOD FOR FORMING A NANO-TEXTURED SUBSTRATE

STATEMENT REGARDING FEDERALLY SPONSORED RESEARCH

This invention was made with Government support under DE-FG36-08GOI8004 awarded by The United States Department of Energy. The Government has certain rights in the invention.

CROSS REFERENCE TO RELATED APPLICATIONS

This application claims the benefit of U.S. Provisional Patent Application Ser. No. 61/320,695, filed Apr. 2, 2010, entitled "Fast and Scalable Printing of Large Area Monolayer Particles for Nanotexturing Applications," which is incorporated herein by reference.

Further, the underlying concepts, but not necessarily the language, of U.S. patent application Ser. No. 12/909,064, filed Oct. 21, 2010 is incorporated by reference.

If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention relates to semiconductor devices in general, and, more particularly, to optoelectronic semiconductor devices.

BACKGROUND OF THE INVENTION

Nanotexturing the surface of a substrate can enhance many physical and chemical functions of the substrate as well as devices formed on the nanotextured surface. It has been demonstrated, for example, that a substrate surface can be made superhydrophobic (i.e., water repelling) or superhydrophylic (i.e., water attractive) by texturing the surface with nano-scale elements. Further, it has recently been demonstrated that texturing a surface with micro- or nano-fiber arrays that mimic gecko foot-hair can create an adhesive surface.

For optoelectronic devices, such as solar cells, lasers, photodetectors, optical modulators, light emitting diodes, and the like, substrates having a surface textured with nanowires, microwires, nanocones, nanodomes, and nanopillars have been shown to improve device performance by providing effective broadband antireflection and light-trapping characteristics both at the surface of the devices as well as within constituent layers.

To date, nanotextured surfaces have been produced using many different processes, such as electron-beam lithography, random chemical etching, vapor-liquid solid growth of nanowires or nanopillars, Langmuir-Blodgett deposition, spin coating, and dip coating. While these methods may be suitable for fundamental studies, they do not readily scale to commercially viable production. Typically production fabrication requires the ability to rapidly deposit layers over large area substrates with low-cost. Further, it is desirable in many applications that deposition processes be compatible with the use of flexible substrates.

A fast, inexpensive method for producing a nanotextured surface on any of a variety of large-area substrates, therefore, is highly desirable.

SUMMARY OF THE INVENTION

The present invention enables large-area substrates having a textured surface. Embodiments of the present invention are well suited for texturing substrates using high-speed, large scale, roll-to-roll coating equipment, such as that used in office product, film coating, and flexible packaging applications. Further, embodiments of the present invention are well suited for use with rigid or flexible substrates.

Prior-art approaches to forming textured substrates require relatively complicated and expensive equipment, such as would typically be used for integrated circuit fabrication. In contrast, the present invention is compatible with low-cost manufacturing equipment, such as high-speed material transfer and film coating systems.

In some embodiments, nano-scale particles are mixed with a solvent comprising ethanol and poly-4-vinylphenol to form a nanoparticle ink. In some embodiments, the nano-scale particles are spheres of silica. The nanoparticle ink is dispensed onto the top surface of a substrate and spread, via a wire-wound rod, to form a layer of wet ink having a substantially uniform thickness. The solvent in this layer of ink is then evaporated, which leaves behind a monolayer of nanoparticles on the top surface of the substrate.

In some embodiments, the concentration of nano-particles in the nanoparticle ink is controlled to enable the formation of multi-layer nanoparticle arrays on the top surface of a substrate.

In some embodiments, at least one property of the nanoparticles, such as particle size and/or concentration is controlled. In some embodiments, at least one property of the solvent, such as viscosity, evaporation rate, and/or contact angle, is controlled to control physical characteristics of the resultant textured surface.

An embodiment of the present invention comprises a method for forming a textured surface on a substrate, the method comprising: dispensing a first material on a first surface of the substrate, wherein the first material comprises nanoparticles and a first solvent; establishing a relative motion between the substrate and a tool that is physically separated from the substrate by a first barrier, wherein the relative motion between the tool and the substrate distributes first material substantially completely over the first surface and forms a first layer having a substantially uniform thickness; and enabling the removal of the first solvent from the first layer.

BRIEF DESCRIPTION OF THE DRAWINGS

FIG. 5A depicts a schematic drawing of substrate 104 after mixture 502 has been dispensed on surface 120.

FIGS. 5B-D depict substrate 104 before, during, and after, respectively, the spreading of mixture 502 on surface 120 by tool 506.

FIG. 5E depicts substrate 104 after the nanoparticles 302 of nascent layer 512 have assembled into texture layer 106.

FIG. 6A depicts a schematic drawing of a cross-sectional view of a tool in accordance with the illustrative embodiment of the present invention.

FIG. 6B depicts a schematic drawing of a cross-sectional view of a tool in accordance with a first alternative embodiment of the present invention.

FIG. 6C depicts a schematic drawing of a cross-sectional view of a tool in accordance with a second alternative embodiment of the present invention.

FIG. 9 depicts a cross-sectional view of region 118 of completed solar cell 100, in accordance with the illustrative embodiment of the present invention.

FIG. 10A depicts a scanning electron microscope image of the top surface of a semiconductor layer structure formed on a nano-textured substrate.

FIG. 10B depicts schematic drawing of a cross-sectional view of a semiconductor layer structure formed on a nano-textured substrate.

DETAILED DESCRIPTION

The following terms are defined for use in this Specification, including the appended claims:

Disposed on is defined as meaning "exists on" an underlying material or layer. This layer may comprise intermediate layers. For example, if a material is described to be "disposed on a substrate," this can mean that either (1) the material is in intimate contact with the substrate; or (2) the material is in contact with one or more interposing layers that reside on the substrate.

Nanoparticle is defined as a particle whose largest dimension is smaller than one micron. Nanoparticles can have any suitable generalized shape, including spherical, facetted, rectangular, square, and irregular.

Figure 1:
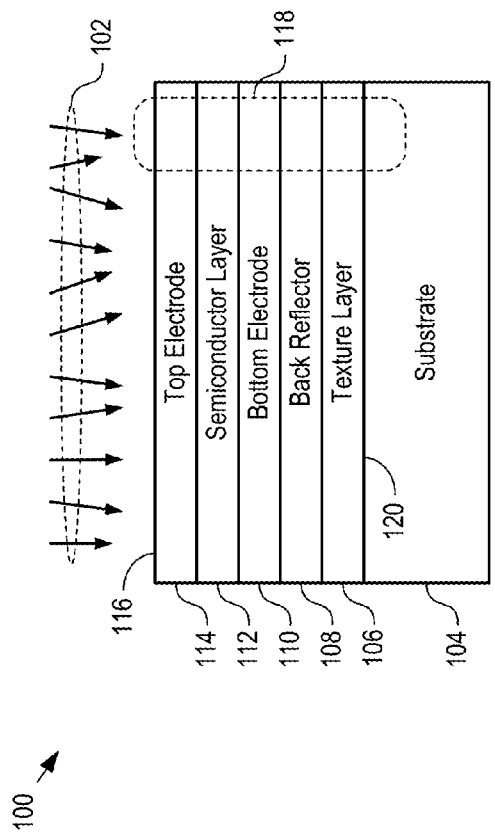
FIG. 1 depicts a schematic drawing of a solar cell structure having a nano-textured surface in accordance with an illustrative embodiment of the present invention.

FIG. 1 depicts a schematic drawing of a solar cell structure having a nano-textured surface in accordance with an illustrative embodiment of the present invention. Solar cell 100 comprises substrate 104, texture layer 106, back reflector 108, bottom electrode 110, optically active layer 112, and top electrode 114. Solar cell 100 is suitable for providing electrical energy when illuminated by sunlight 102.

It should be noted that although the illustrative embodiment comprises a semiconductor device that is a solar cell, the present invention is applicable to other semiconductor devices, such as light-emitting diodes, fuel cells, lasers, optical modulators, thermionics, thermal photovoltaic and photodetectors. It should be further noted that, in embodiments of the present invention directed toward optical applications, the wavelength range of interest is dependent upon the application. Device-specific characteristics, such as wavelength sensitivity, nano-texture periodicity, material composition, etc., are also based on the intended application. As a result, material properties, material characteristics, and physical dimensions provided for elements of solar cell 100 are based on solar cell applications and are merely exemplary. One skilled in the art will recognize that these parameters, among others, can be different for embodiments of the present invention intended for different applications.

Sunlight 102 spans a very broad spectral range from approximately 300 nm to approximately 2000 nm. For practical purposes, however, the spectral range of interest for solar cell technology is typically approximately 300 nm to approximately 1200 nm. It should be noted that a significant portion of this spectral range is above the bandgap wavelength of a typical solar cell structure. For example, for an amorphous silicon-based solar cell, which has a bandgap wavelength of approximately 700 nm, the spectral range of interest typically includes wavelengths from approximately 300 nm to approximately 800 nm.

Figure 2:
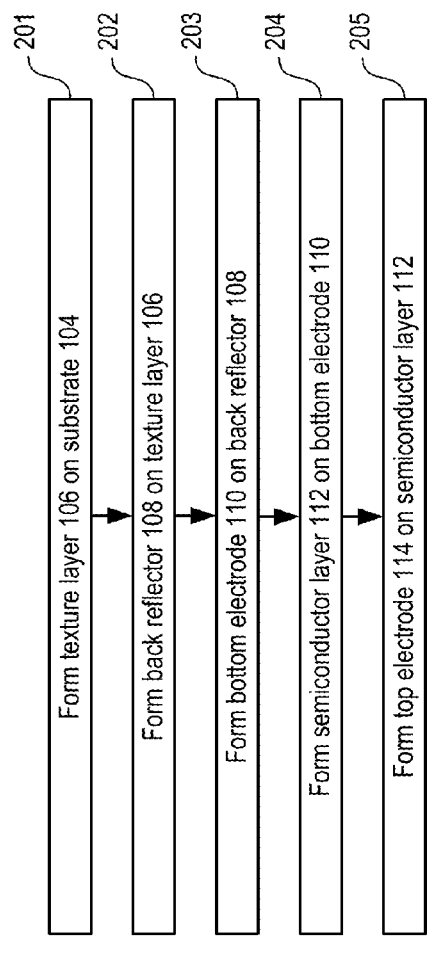
FIG. 2 depicts operations of a method for forming a solar cell in accordance with the illustrative embodiment of the present invention.

FIG. 2 depicts operations of a method for forming a solar cell in accordance with the illustrative embodiment of the present invention. Method 200 begins with operation 201, wherein texture layer 106 is formed on surface 120 of substrate 104. Method 200 is described herein with continuing reference to FIG. 1.

Figure 3:
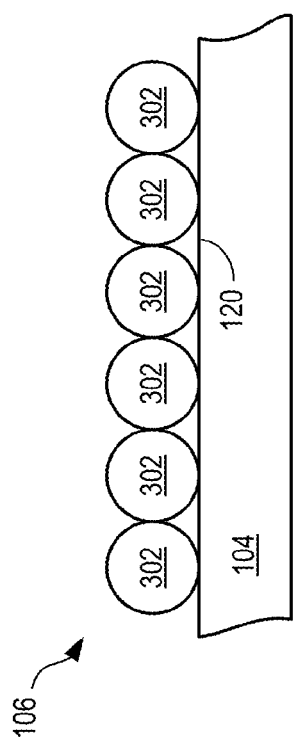
FIG. 3 depicts a portion of a substrate comprising a texture layer in accordance with the illustrative embodiment of the present invention.

FIG. 3 depicts a portion of a substrate comprising a texture layer in accordance with the illustrative embodiment of the present invention. Texture layer 106 comprises a monolayer of nanoparticles 302, which are substantially uniformly distributed on surface 120. In some embodiments, texture layer 106 comprises a plurality of layers of nanoparticles 302.

Substrate 104 is a soda-lime glass substrate that is substantially transparent in the wavelength range of interest. In some embodiments, substrate 104 is a rigid substrate comprising a different material, such as a semiconductor, ceramic, glass, metal, dielectric, and the like. In some embodiments, substrate 104 is a flexible substrate comprising a suitable material, such as polymers, polyethylene, polyethylene terephthalate, ferropaper, carbon-impregnated paper, parylene-N, and the like.

Nanoparticles 302 silica particles having substantially spherical shape and an average diameter within the range of approximately 100 nanometers (nm) to approximately 600 nm. In the illustrative embodiment, nanoparticles 302 have a diameter of approximately 400 nm. In some embodiments, nanoparticles 302 comprise a different material, such as a dielectric, metal, polymer, and the like. Further, in some embodiments, nanoparticles 302 have a different shape and/or size.

Figure 4:
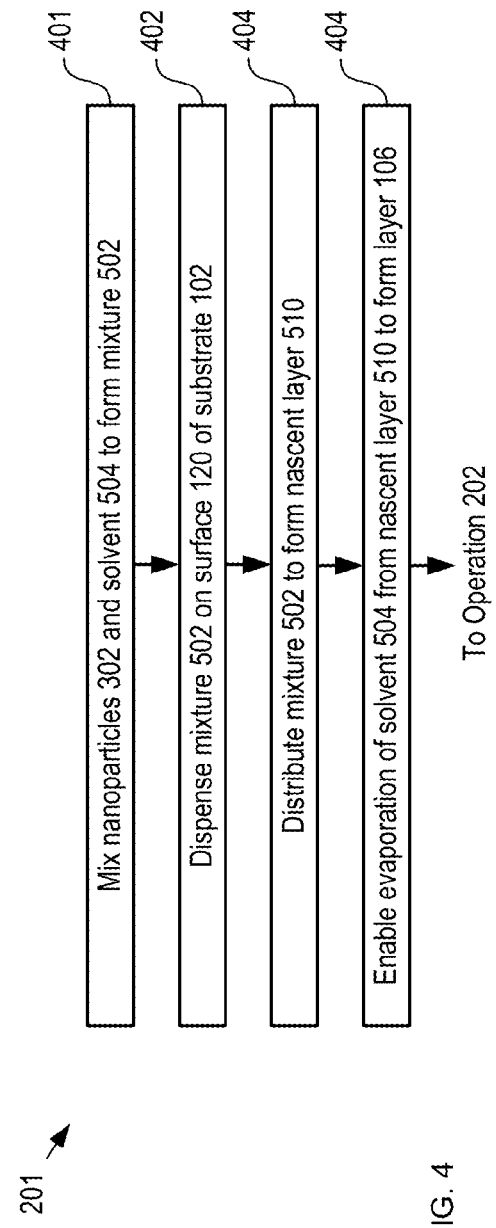
FIG. 4 depicts sub-operations suitable for use in operation 201 in accordance with the illustrate embodiment of the present invention.

FIG. 4 depicts sub-operations suitable for use in operation 201 in accordance with the illustrate embodiment of the present invention. Operation 201 is described herein with continuing reference to FIGS. 1 and 3, and with additional reference to FIGS. 5A-E. Operation 201 begins with sub-operation 401, wherein mixture 502 is formed.

Mixture 502 is prepared by mixing nanoparticles 302 at a concentration of approximately 50 grams/liter (g/l) in solvent 504. In some embodiments, the nanoparticles and solvent form a colloidal solution. Solvent 504 comprises PVPh at a concentration of approximately 0.2% by weight in ethanol. In some embodiments, the concentration of nanoparticles in mixture 502 is within the range of approximately 10 g/l to approximately 400 g/l. In some embodiments, the concentration of PVPh is within the range of approximately 0.2% to approximately 5%.

In some embodiments, mixture 502 is prepared by mixing nanoparticles a solvent that is a mixture of a different suitable alcohol and liquid polymer or monomer. Alcohols suitable for use in mixture 502 include, without limitation, ethanol, methanol, polypropanol, isopropanol, and the like. Liquid polymers suitable for use in mixture 502 include, without limitation, poly-4-vinylphenol (PVPh), 2-pyrrolidone, poly-vinylpolypyrrolidone, and the like.

It is an aspect of the present invention that the internal properties of mixture 502 significantly affect the characteristics of texture layer 106. Specifically, contact angle, evaporation rate, viscosity, and nanoparticle concentration of mixture 502 control the quality and structure of texture layer 106. As a result, in sub-operation 401, control of the concentration of nanoparticles and PVPh in the alcohol that constitutes the bulk of mixture 502 enables control of the internal properties of mixture 502 and, therefore, the characteristics of texture layer 106. The impact that size, type, nanoparticle concentration and liquid polymer concentration in mixture 502 have on the properties of a texture layer is discussed below and with respect to FIGS. 7A-B and 8A-C.

At sub-operation 402, mixture 502 is dispensed onto surface 120 using a conventional liquid dispensing technique.

FIG. 5A depicts a schematic drawing of substrate 104 after mixture 502 has been dispensed on surface 120.

At sub-operation 403, tool 506 distributes mixture 502 on surface 120 to form nascent layer 512.

FIG. 6A depicts a schematic drawing of a cross-sectional view of a tool in accordance with the illustrative embodiment of the present invention. Tool 506 is a conventional wire-wound rod, which comprises rod 508 and barrier 510.

Rod 508 is a substantially rigid rod. Typically, rod 508 has a diameter within the range of approximately 3 millimeters (mm) to approximately 40 mm. It will be clear to one skilled in the art, however, after reading this specification, how to specify, make, and use alternative embodiments of the present invention wherein rod 508 has any suitable diameter.

Barrier 510 is a wire that is wound around rod with a substantially uniform spacing, P, between individual windings to form a plurality of grooves 602. The thickness of barrier 510 is equal to the thickness of the wire, h1, which is typically within the range of approximately 0.05 mm to approximately 2.5 mm. In the illustrative embodiment, h1 is equal to approximately 0.23 mm and P is also substantially equal to 0.23 mm. It will be clear to one skilled in the art, however, after reading this specification, how to specify, make, and use alternative embodiments of the present invention wherein barrier 510 has any suitable diameter.

FIGS. 5B-D depict substrate 104 before, during, and after, respectively, the spreading of mixture 502 on surface 120 by tool 506. Mixture 502 is distributed on surface 120 by establishing a relative motion between tool 506 and substrate 104, along the x-direction, and enabling tool 506 to pass through the mixture. As tool 506 passes through the mixture, the tool sweeps some of the mixture from surface 120 leaving behind a volume of solution equal to the aggregate volume of grooves 602 of barrier 508. This remaining volume of mixture 502 forms nascent layer 512 as a substantially uniform film having a thickness of t1. The thickness, t1, of nascent layer 512 is based on the values of P1 and h1. In the illustrative embodiment, for example, a wire-wound rod wherein both P1 and h1 are equal to 0.23 mm yields a nascent layer 512 having a thickness of approximately 20.57 microns.

In some embodiments, the relative motion is established by tool 506 while substrate 104 remains stationary. In some embodiments, substrate 104 is moved while tool 506 is stationary. In some embodiments, both rod 508 and substrate 104 are moved. Suitable coating systems known in the prior art include roll-to-roll transfer systems, film emulsion coating systems, wire-wound rod coating systems, and doctor-blade systems, among others.

FIG. 6B depicts a schematic drawing of a cross-sectional view of a tool in accordance with a first alternative embodiment of the present invention. Tool 604 comprises rod 508 and barrier 606. Tool 604 is analogous to tool 506. Barrier 606 comprises a plurality of shoulders 608, which collectively define a plurality of grooves 610. Barrier 606 is analogous to barrier 510 and grooves 610 are analogous to grooves 602. The thickness, t1, of a nascent layer formed using tool 604 is based on the values of P2 and h2.

FIG. 6C depicts a schematic drawing of a cross-sectional view of a tool in accordance with a second alternative embodiment of the present invention. Tool 612 is a doctor-blade system that comprises blade 614 and barrier 616. Barrier 616 comprises a frame that defines a separation substantially equal to t1 between blade 614 and surface 120. In operation, blade 614 passes through mixture 502, while the blade is in contact with barrier 616, which screens mixture 502 from surface 120 except for the material located in the volume defined by surface 120, blade 614, and barrier 616. This results in the formation of nascent layer 512 with a substantially uniform thickness equal to t1.

Returning now to operation 201, at sub-operation 404, the assembly of nanoparticles 302 into texture layer 512 is enabled by the removal of solvent 504 from nascent layer 512. As a result, the nanoparticles in nascent layer 512 assemble into texture layer 106. In some embodiments, the temperature of substrate 104 is controlled to control the rate of evaporation of solvent 504 from nascent layer 512.

In some embodiments, sub-operation 404 comprises heating substrate 104 to increase the rate of evaporation solvent 504. In some embodiments, substrate 104 is maintained substantially at room temperature to enable solvent 504 to evaporate from nascent layer 512. In some embodiments, substrate 104 is cooled below room temperature to retard the rate of evaporation of solvent 504 from nascent layer 512.

FIG. 5E depicts substrate 104 after the nanoparticles 302 of nascent layer 512 have assembled into texture layer 106.

The coverage of mixture 502 on surface 120 and the rate at which solvent 504 is removed from nascent layer 512 have significant impact on the characteristics of texture layer 106. A high-quality texture layer results, for example, when mixture 502 substantially completely wets the substrate and evaporates from surface 120 at a rate suitable for enabling the nanoparticles to assemble as desired. Control over the internal properties of solvent 504 (e.g., contact angle, evaporation rate, and viscosity), therefore, plays a critical role in obtaining a satisfactory texture layer 106. In some embodiments of the present invention, the concentration of liquid polymer in solvent 504 is controlled to control the internal properties of the solvent.

For example, in the illustrative embodiment, solvent 504 comprises 0.2% (by weight) of PVPh mixed in ethanol. Once mixture 502 is spread evenly by tool 506, solvent 504 begins to evaporate, beginning with that portion of nascent layer 512 formed first. At this concentration of PVPh, mixture 502 wets semiconductor, as well as polymer-based substrates, substantially completely. For embodiments wherein solvent 504 comprises PVPh and ethanol, preferred PVPh concentration is within the range of approximately 0.1% to approximately 0.5% (by weight), and preferably 0.2% (by weight). It should be noted, however, concentrations of PVPh up to 10% (by weight) are characterized by a contact angle below approximately 20 degrees, are typically below 5 degrees, and are, in some concentrations, close to zero. PVPh is merely one example of a liquid polymer that, when added to solvent 504, decreases its evaporation rate and increases its viscosity.

Further, the evaporation rate and viscosity of solvent 504 directly impact the manner in which the nanoparticles assembly on surface 120 to form texture layer 106. During the evaporation of solvent 504 from nascent layer 512, the solvent thins to a liquid layer approximately equal to the diameter of nanoparticles 302. As this occurs, it is desirable that the solvent forms a continuous meniscus between the nanoparticles. This meniscus induces a capillary force that drives the nanoparticles together, thereby nucleating a thin film assembly. This nucleate grows from the convective flux of nanoparticles towards the drying front of the wet film.

Figure 7A:
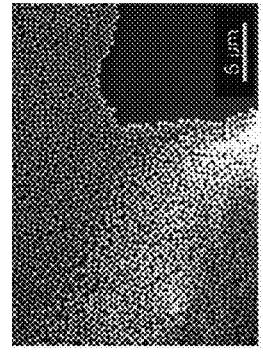
FIG. 7A depicts a scanning electron microscope image of a texture layer in accordance with the illustrative embodiment of the present invention.

FIG. 7A depicts a scanning electron microscope image of a texture layer in accordance with the illustrative embodiment of the present invention. Texture layer 700 was formed using a nanoparticle ink analogous to mixture 502. The nanoparticle ink contained 400 nm-diameter silica nanoparticles at a concentration of 50 g/l in a solvent of ethanol and 0.2% of PVPh (by weight).

Figure 7B:
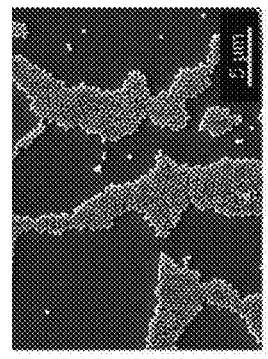
FIG. 7B depicts a scanning electron microscope image of a texture layer formed using a first nanoparticle ink not in accordance with the present invention.

FIG. 7B depicts a scanning electron microscope image of a texture layer formed using a first nanoparticle ink not in accordance with the present invention. Texture layer 702 is a nanoparticle layer formed using a nanoparticle ink comprising ethanol without a liquid polymer (i.e., pure ethanol).

Pure ethanol has an evaporation rate (at room temperature) of approximately 164 micrograms/second and a viscosity of approximately 1.07 centipoise. As a result, pure ethanol is too volatile and has a viscosity that is too low to enable formation of a high-quality texture layer. Instead, as it dries, the resultant nascent layer will separate into individual droplets during operation 404 leaving a poorly assembled texture layer.

Figure 7C:
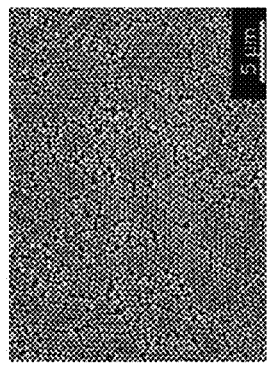
FIG. 7C depicts a scanning electron microscope image of a texture layer formed using a second nanoparticle ink not in accordance with the present invention.

FIG. 7C depicts a scanning electron microscope image of a texture layer formed using a second nanoparticle ink not in accordance with the present invention. Texture layer 704 is a nanoparticle layer formed using a nanoparticle ink comprising ethanol mixed in even proportions with ethylene glycol.

Ethylene glycol has a much lower vapor pressure (0.06 mmHg at 20° C.) than that of ethanol (44 mmHg at 20° C.). As a result, a 1:1 mixture of ethanol and ethylene glycol has an evaporation rate (at room temperature) of less than 10 micrograms/second, which is significantly lower than the evaporation rate of pure ethanol. In addition, a 1:1 mixture of ethanol and ethylene glycol has a viscosity of approximately 6.89 centipoise, more than six times that of pure ethanol. Unfortunately, the different vapor pressures of ethanol and ethylene glycol result in non-uniform drying of a nascent layer comprising such a solvent. Further, non-uniform drying leads to a change in the contact angle of the nanoparticle ink, which leads to improper assembly of the nanoparticles in texture layer 704.

By controlling (1) the evaporation rate of solvent 504 to be within the range of approximately 70 micrograms/second to approximately 130 micrograms per second, and (2) the viscosity of solvent 504 to be within the range of approximately 1.08 centipoise to approximately 4.06 centipoise, and (3) the contact angle to be below 5 degrees, the assembly of nanoparticles 302 can be controlled to form a well-ordered texture layer.

It is another aspect of the present invention that the concentration and size of nanoparticles 302 directly impact the structure of texture layer 106. As nanoparticle concentration increases, the number of nanoparticle layers in texture layer 106 also increases. For example, using the same solvent and deposition method, texture layers having different number of nanoparticle layers can be formed simply by changing the concentration of nanoparticles dispersed in the solvent.

Figure 8A:
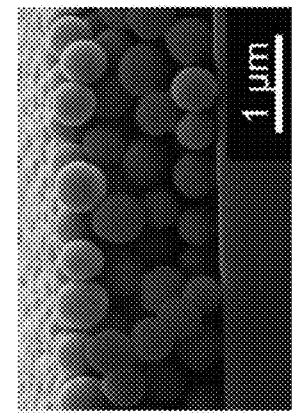
FIGS. 8A-C depict scanning electron microscope images of texture layers formed from nanoparticle inks having different nanoparticle concentrations.
Figure 8B:
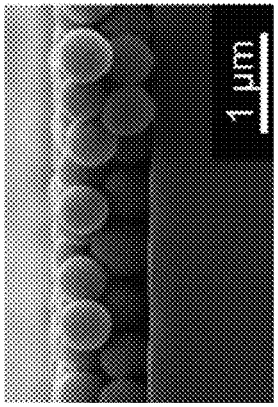
Figure 8C:
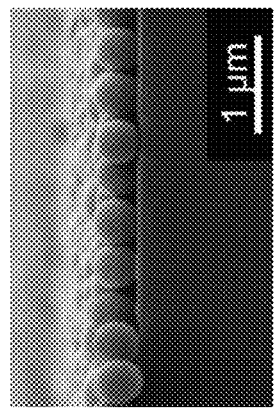

FIGS. 8A-C depict scanning electron microscope images of texture layers formed from nanoparticle inks having different nanoparticle concentrations.

Texture layer 800 (FIG. 8A) was formed using a nanoparticle ink analogous to mixture 502. The nanoparticle ink contained 400 nm-diameter silica nanoparticles at a concentration of 50 g/l in a solvent of ethanol and 0.2% of PVPh (by weight).

Texture layer 802 (FIG. 8B) was formed using a nanoparticle ink containing silica nanoparticles having a diameter of approximately 400 nm at a concentration of 100 g/l in a solvent comprising ethanol and 0.2% of PVPh (by weight).

Texture layer 804 (FIG. 8C) was formed using a nanoparticle ink containing silica nanoparticles having a diameter of approximately 400 nm at a concentration of 200 g/l in a solvent comprising ethanol and 0.2% of PVPh (by weight).

For nanoparticle concentrations of 50, 100, and 200 g/l, the number of nanoparticle layers was proportional at one, two, and four layers, respectively. It should be noted that the uniformity of the multi-layered films is comparable to that of the monolayer film and that this concentration dependence is found for semiconductor and polymer-based substrates.

The ability to form texture layers having different numbers of layers affords embodiments of the present invention with advantages over the prior art in different applications.

In some embodiments, sub-operation 404 is followed by an optional oxygen plasma treatment (or equivalent) to ensure complete removal of solvent 504 from nascent layer 512.

Returning now to method 200, at operation 202, back reflector 108 is formed on texture layer 106 using conventional metal deposition techniques. Back reflector 108 is a layer of silver having a thickness of approximately 100 nm. Back-reflector 108 is substantially conformal with texture layer 106. Silver provides high reflectivity for light having a wavelength within the range of interest for solar cell 100. In some embodiments, back-reflector 108 comprises a reflective layer other than silver. It will be clear to one skilled in the art, after reading this specification, how to specify, make, and use back-reflector 108.

At operation 203, bottom electrode 110 is formed on back reflector 108. Bottom electrode 110 is deposited on back-reflector 106 using conventional deposition techniques. Bottom electrode 110 is a layer of transparent conductive oxide having a thickness of approximately 80 nm. Bottom electrode 110 is substantially conformal with back reflector 108. Materials suitable for use in bottom electrode 110 include, without limitation, indium-tin oxide, zinc-oxide, aluminum-zinc-oxide, and the like. It will be clear to one skilled in the art, after reading this specification, how to specify, make, and use bottom electrode 110.

At operation 204, semiconductor layer 112 is formed on bottom electrode 110. Semiconductor layer 112 is a composite layer comprising a plurality of hydrogenated amorphous silicon layers that collectively define a p-i-n solar cell. All of the layers that collectively define semiconductor layer 112 are conformally deposited on bottom electrode 110 using conventional deposition techniques. In some embodiments, semiconductor layer 112 comprises one or more semiconductor layers suitable for a semiconductor device other than a solar cell.

At operation 205, top electrode 114 is formed on semiconductor layer 112 using conventional deposition techniques. Top electrode 114 is substantially conformal with semiconductor layer 112. Top electrode 114 is analogous to bottom electrode 108 and has a thickness of approximately 80 nm. Electrodes 108 and 114 enable electrical connectivity to semiconductor layer 112.

Top electrode 114 also functions as an anti-reflection layer for semiconductor layer 112. In the illustrative embodiment, top electrode 114 comprises indium-tin-oxide (ITO), which has a refractive index suitable for an anti-reflection layer for semiconductor layer 112, which has a refractive index of approximately 4.

FIG. 9 depicts a cross-sectional view of region 118 of completed solar cell 100, in accordance with the illustrative embodiment of the present invention. Since each of layers 108, 110, 112, and 114 are substantially conformal, the nano-texture of texture layer 106 propagates through these layers such that surface 116 is a nano-textured surface as well. Providing nano-texture to a semiconductor layer can reduce its reflectivity and increase its absorption as compared to a comparable planar semiconductor layer.

In some embodiments, an increased absorption in semiconductor layer 112, due to its nano-textured nature, obviates the configuration of top electrode 114 as an anti-reflection layer. Further, in some embodiments, an increased absorption in semiconductor layer 112 enables the use of co-planar electrical contacts disposed beneath semiconductor layer 112 and top electrode 114 is, therefore, not included in the device structure.

As discussed in detail in U.S. patent application Ser. No. 12/909,064, substrates comprising a texture layer of nanoparticles (i.e., nano-textured substrates) can improve the performance of semiconductor devices formed on them—particularly optoelectronic semiconductor devices.

Nano-textured substrates have been shown to improve light absorption in semiconductor thin-films by reducing reflection and increasing light scattering within the semiconductor material. The anti-reflection effect has already been demonstrated by several nano-textured structures, such as solar cells and silica sphere monolayers. It has been demonstrated that nano-textured substrates based on dielectric nanoparticles having diameters comparable to the wavelength of incident light exhibit a strong Mie scattering effect. This effect can be used for increasing the light path length and ultimately absorption. Further, light scattering effects have also found particular use in plasmonic systems, wherein the nanoparticles comprise metal.

The texture of texture layer 106 propagates upward through the layer structure to the top surface of the solar cell (i.e., surface 116). As a result, surface 116 has a topography characterized by dome-shaped regions (nano-domes). In some embodiments, these nano-domes are periodic with a periodicity that is less than or comparable to the wavelengths of light within the spectral range of interest. In some embodiments, the dome-shaped regions have size and/or periodicity larger than the wavelengths of light within the spectral range of interest. Further, in some embodiments, the dome-shaped regions are arranged in an aperiodic manner (e.g., random or semi-random) in at least one dimension.

For optoelectronic devices, in particular, the nano-textured nature of surface 116 affords embodiments of the present invention with several advantages, including:
  i. improved light absorption over a wavelength band of interest; or
  ii. improved light coupling into semiconductor layer 112; or
  iii. reduced reflectivity over the wavelength band of interest; or
  iv. any combination of i, ii, and iii.

FIG. 10A depicts a scanning electron microscope image of the top surface of a semiconductor layer structure formed on a nano-textured substrate.

FIG. 10B depicts schematic drawing of a cross-sectional view of a semiconductor layer structure formed on a nano-textured substrate.

Structure 1000 comprises layer structure 1006, which is disposed on texture layer 1004, which is disposed on substrate 1002.

Substrate 1002 is a conventional substantially transparent soda-lime glass substrate.

Texture layer 1004 is a close-packed monolayer of silica nanoparticles having a diameter of approximately 400 nm. Texture layer 1004 is formed on surface 1012 of substrate 1002 in accordance with the present invention.

Layer structure 1006 comprises bottom contact layer 1008, semiconductor layer 1010, and top contact layer 1012.

Bottom contact layer 1008 is a layer of ITO having a thickness of approximately 80 nm.

Semiconductor layer 1010 is a layer of hydrogenated amorphous silicon having a thickness of approximately 280 nm.

Top contact layer 1012 is a layer of ITO having a thickness of approximately 80 nm.

Bottom contact layer 1008 and top contact layer 1012 are substantially transparent for light in the wavelength range of 400 nm to 800 nm. As a result, top contact layer 1012 transmits approximately 89% of light in this wavelength range incident on structure 1000 to semiconductor layer 1010. ITO and hydrogenated amorphous silicon have a large dielectric contrast, however, which enables bottom contact layer 1008 and top contact layer 1012 to serve as confining layers for light once it is within semiconductor layer 1010.

Figure 10C:
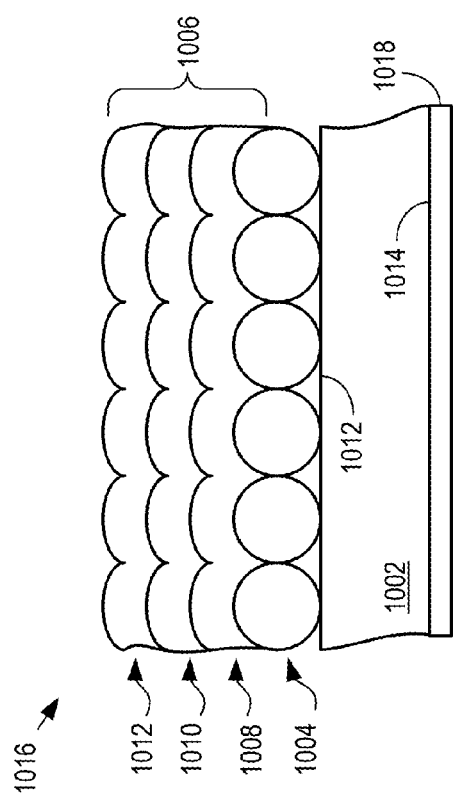
FIG. 10C depicts a schematic drawing of a cross-sectional view of structure 1000 including a back-side reflection layer.

FIG. 10C depicts a schematic drawing of a cross-sectional view of structure 1000 including a back-side reflection layer. Structure 1016 comprises structure 1000 and reflection layer 1018.

Reflection layer 1018 is a layer of silver having a thickness of approximately 100 nm. Reflection layer 1018 is disposed on back surface 1014 of substrate 1002.

Figure 10D:
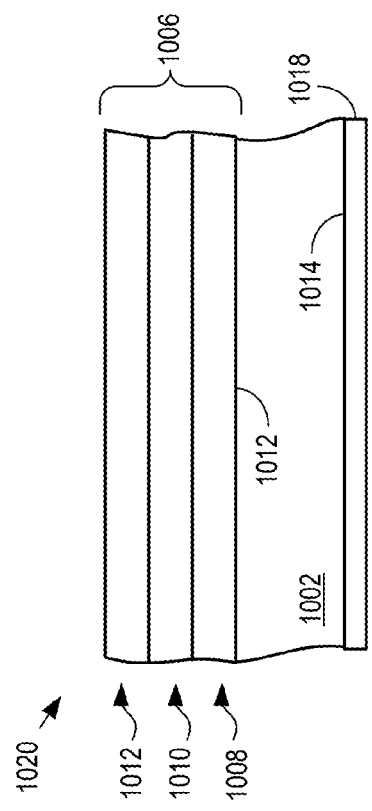
FIG. 10D depicts a schematic drawing of a cross-sectional view of layer structure 1006 formed directly on planar substrate 1002.

FIG. 10D depicts a schematic drawing of a cross-sectional view of layer structure 1006 formed directly on planar substrate 1002.

Structure 1020 does not include texture layer 1004. As a result, each of the layers of structure 1006 is a conventional planar layer. Structure 1020 includes reflection layer 1018 disposed on back surface 1014 of substrate 1002.

Figure 11A:
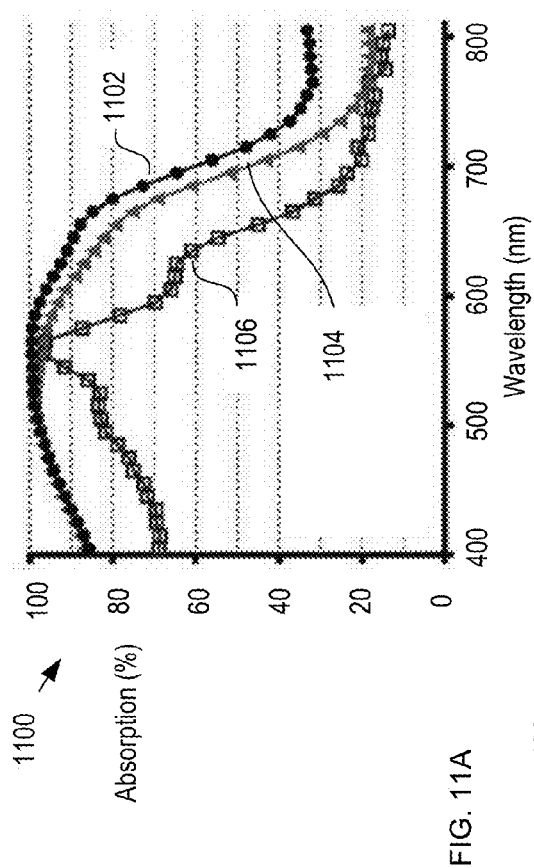
FIG. 11A depicts measured light absorption in structures 1000, 1016, and 1020 over the wavelength range from 400 nm to 800 nm.

FIG. 11A depicts measured light absorption in structures 1000, 1016, and 1020 over the wavelength range from 400 nm to 800 nm. Plot 1100 comprises: trace 1102, which corresponds to the absorption of a structure 1000; trace 1104, which corresponds to the absorption of a structure 1016; and trace 1106, which corresponds to the absorption of a structure 1020.

Comparing traces 1102 and 1104 with trace 1106, the nano-textured layers demonstrate an enhanced absorption of approximately 40% and 68%, respectively, compared with the planar layers. This improvement is attributed to an increase in the effective anti-reflection characteristics of their top surfaces and an increase in the scattering of light within their respective semiconductor layers 1010. Both of these effects derive from the nano-texture in layers 1008, 1010, and 1012.

It is noteworthy that both nano-textured structures (i.e., structures 1000 and 1016) showed the same enhancement between 400 and 550 nm, which suggests the incoming light in this wavelength range was absorbed in a single pass through the structure and the enhancement comes from reduced reflection. In the wavelength range beyond 550 nm, however, the light absorption in structure 1016 is greater than for structure 1000. It is concluded that the long-wavelength light that is not absorbed in a single pass through semiconductor layer 1010 is reflected back into the layer by reflection layer 1018.

Path-length enhancement is seen as particularly strong for wavelengths beyond 720 nm, where the absorption length in hydrogenated amorphous silicon is greater than 10 μm. The addition of reflection layer 1018 increased the absorption between 750 and 800 nm by 70%, for example.

Figure 11B:
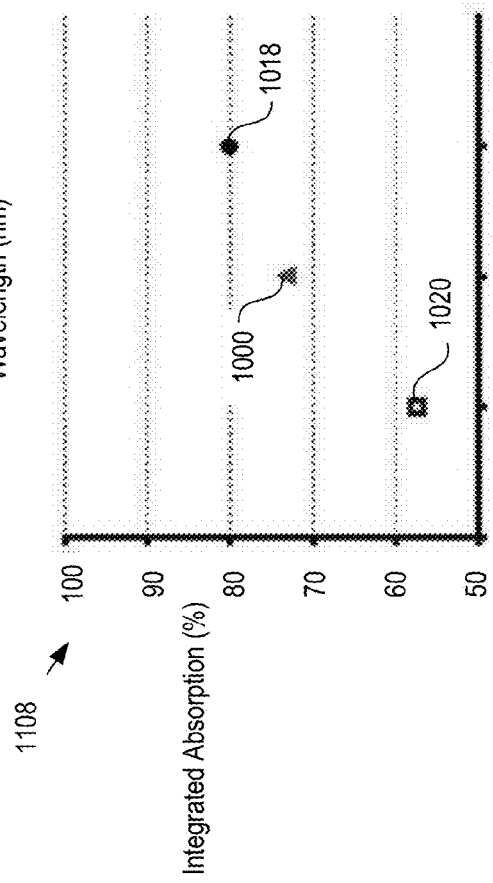
FIG. 11B depicts measured total absorption for structures 1000, 1016, and 1020 integrated over the Air Mass 1.5 solar spectrum over the wavelength range from 400 nm to 800 nm.
Figure 12B:
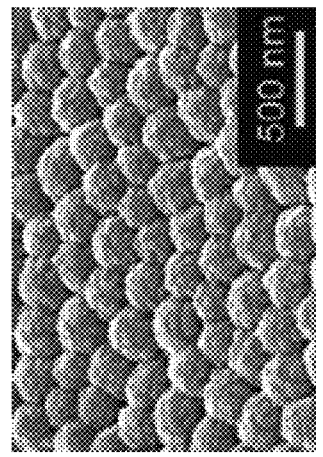
FIGS. 12A-D depict scanning electron microscope images of structure 1006 disposed on texture layers comprising nanoparticles of different diameters.
Figure 12D:
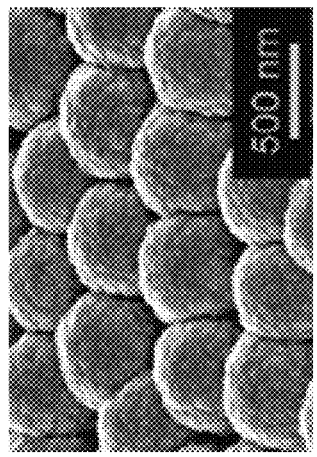
Figure 12A:
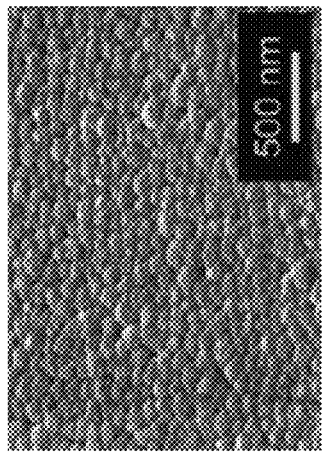
Figure 12C:
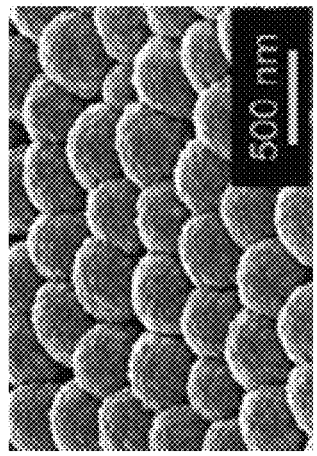

FIG. 11B depicts measured total absorption for structures 1000, 1016, and 1020 integrated over the Air Mass 1.5 solar spectrum over the wavelength range from 400 nm to 800 nm. It is clear from plot 1108 that each of nano-textured structures 1000 and 1018 exhibits higher absorption compared to planar structure 1020. Structure 1018 absorbs approximately 81% and structure 1000 absorbs approximately 73% compared to absorption of only 57% for planar structure 1020. As a result, a nano-textured structure is well suited for use as a light-trapping template in photovoltaic applications.

It is another aspect of the present invention that control of the size of nanoparticles 302 enables control over the light absorption characteristics of a nano-textured semiconductor device. This is of particular benefit for photovoltaic applications.

FIGS. 12A-D depict scanning electron microscope images of structure 1006 disposed on texture layers comprising nanoparticles of different diameters.

Sample 1200 comprises structure 1006 formed on a monolayer texture layer comprising spherical silica nanoparticles having a diameter of approximately 100 nm.

Sample 1202 comprises structure 1006 formed on a monolayer texture layer comprising spherical silica nanoparticles having a diameter of approximately 220 nm.

Sample 1204 comprises structure 1006 formed on a monolayer texture layer comprising spherical silica nanoparticles having a diameter of approximately 400 nm.

Sample 1206 comprises structure 1006 formed on a monolayer texture layer comprising spherical silica nanoparticles having a diameter of approximately 600 nm.

The texture of the surface of nano-textured samples grown on spherical nanoparticles is characterized by an arrangement of "dome" structures. The physical characteristics of these dome structures reflect the size of the nanoparticles on which they are formed. FIGS. 12A-D show that the shape of structures fabricated on small nanoparticles is less dome-shaped and approaches a nearly flat surface. As the size of the nanoparticles increases, the dome-like structure of the top surface becomes more pronounced.

The dome-like characteristic of a surface affords embodiments of the present invention significant advantages—particularly optoelectronic device embodiments. Light incident on a textured surface sees a gradual change of refractive index from air to the absorber layer. This gradual change results from the increasing cross-sectional diameter of the nanoparticles as the light propagates through the structure. As a result, a nano-textured surface has an effective refractive index that is between that of air and that of the top layer, which reduces the reflectivity of the top surface of the nano-textured structure. In other words, the nano-textured surface provides an enhanced anti-reflection effect. This enhanced anti-reflection effect is more pronounced for structures formed on larger nanoparticles since nanoparticles having diameters well below the wavelength of incident light are less effective at reducing reflection from the top surface.

Further, larger nanoparticles induce more pronounced dome shapes on the top surface of a formed device structure. Pronounced dome shapes contribute to light trapping through Mie scattering.

Figure 13A:
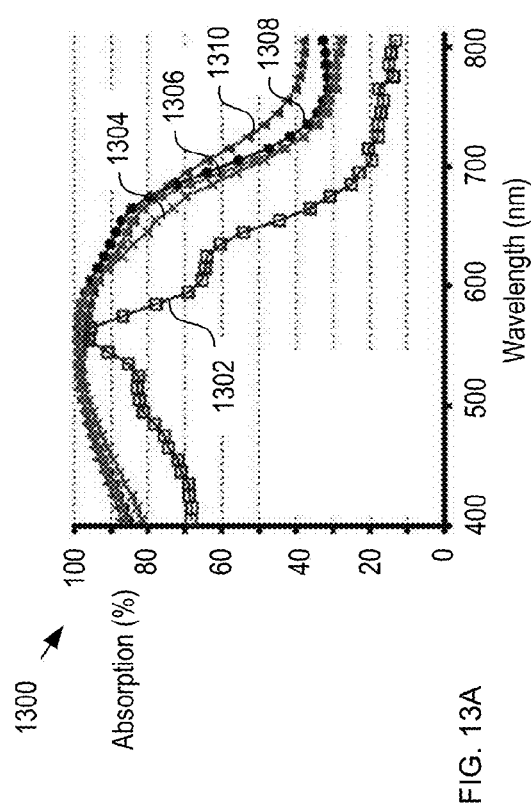
FIG. 13A depicts measured light absorption for samples 1200, 1202, 1204, 1206 and 1020 over the wavelength range from 400 nm to 800 nm.

FIG. 13A depicts measured light absorption for samples 1200, 1202, 1204, 1206 and 1020 over the wavelength range from 400 nm to 800 nm.

Plot 1300 comprises: trace 1302, which corresponds to the absorption of sample 1020; trace 1304, which corresponds to the absorption of sample 1200; trace 1306, which corresponds to the absorption of sample 1202; trace 1308, which corresponds to the absorption of sample 1204; and trace 1310, which corresponds to the absorption of sample 1206. Plot 1300 shows that structures with smaller nanoparticle diameters (i.e., samples 1200 and 1202) exhibit lower absorption than structures with larger nanoparticle diameters at nearly every wavelength. This is primarily due to higher reflection from their less-textured surfaces. Samples 1204 and 1206, in contrast, exhibited significant enhancement, as compared to samples 1200, 1202, and 1020, over the wavelength range of 550~670 nm, and 670~800 nm, respectively.

Figure 13B:
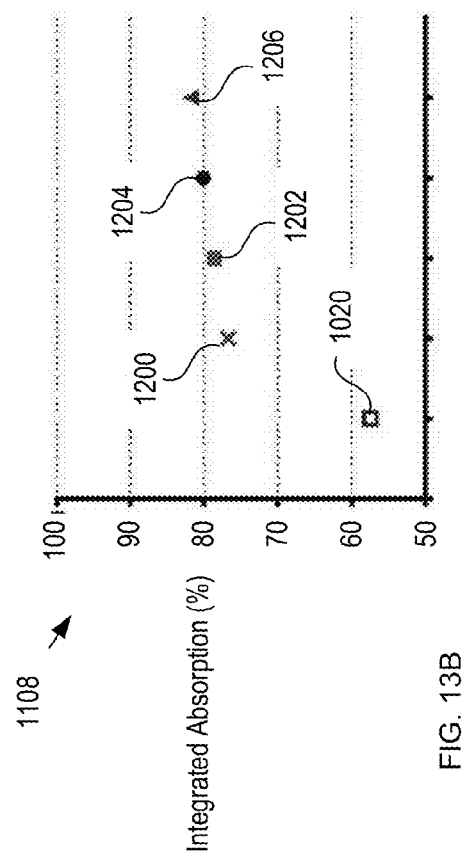
FIG. 13B depicts measured total absorption for structures 1020, 1200, 1202, 1204, and 1206 integrated over the Air Mass 1.5 solar spectrum over the wavelength range from 400 nm to 800 nm.

FIG. 13B depicts measured total absorption for structures 1020, 1200, 1202, 1204, and 1206 integrated over the Air Mass 1.5 solar spectrum over the wavelength range from 400 nm to 800 nm. It is clear from plot 1312 that absorption scales with nanoparticle size.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method for forming a textured surface on a substrate, the method comprising:
   providing a first material comprising nanoparticles and a first solvent;
   dispensing the first material on a first surface of the substrate;
   establishing a relative motion between the substrate and a tool that is physically separated from the substrate by a first barrier, wherein the relative motion between the tool and the substrate distributes first material substantially completely over the first surface and forms a first layer having a substantially uniform thickness and at least one monolayer of nanoparticles;
   enabling the removal of the first solvent from the first layer; and controlling the number of nanoparticle monolayers in the first layer by controlling a concentration of the nanoparticles in the first material to within a range of approximately 10 grams/liter to approximately 400 grams/liter.

2. The method of claim 1, wherein the concentration of nanoparticles in the first material is one of approximately 50 grams/liter, approximately 100 grams/liter, or approximately 200 grams/liter.

3. The method of claim 1 further comprising providing the first material such that the first solvent comprises an alcohol and a liquid polymer.

4. The method of claim 3 wherein the first material is provided such that the alcohol is ethanol and the liquid polymer is poly-4-vinylphenol.

5. The method of claim 1 further comprising providing the first material such that the nanoparticles comprise silica.

6. The method of claim 1 wherein the first material is provided such that the nanoparticles have an average diameter within the range of approximately 100 nm to approximately 600 nm.

7. A method for forming a textured surface on a substrate, the method comprising:
 providing a first material, wherein the first material comprises nanoparticles and a first solvent, the first solvent comprises an alcohol and poly-4-vinylphenol;
 dispensing the first material on a first surface of a substrate;
 establishing a relative motion between the substrate and a tool that is physically separated from the substrate by a first barrier, wherein the relative motion between the tool and the substrate distributes first material substantially completely over the first surface and forms a first layer having a substantially uniform thickness and at least one monolayer of nanoparticles, and wherein the thickness of the first layer is based on the barrier; and
 enabling evaporation of the first solvent from the first layer.

8. The method of claim 7 further comprising providing the barrier as a wire that is wrapped around the tool, wherein thickness of the first layer is substantially equal to the diameter of the wire.

9. The method of claim 7 further comprising providing the barrier as at least one groove formed in the tool, wherein thickness of the first layer is substantially equal to the depth of the groove.

10. The method of claim 7 further comprising providing the barrier as a frame that interposes the first surface and the tool, wherein the thickness of the first layer is substantially equal to the thickness of the frame.

* * * * *